United States Patent

Woo et al.

[11] Patent Number: 6,054,331
[45] Date of Patent: Apr. 25, 2000

[54] APPARATUS AND METHODS OF DEPOSITING A PLATINUM FILM WITH ANTI-OXIDIZING FUNCTION OVER A SUBSTRATE

[75] Inventors: Hyun Jung Woo, Sungnam Kyunggi-Do; Dong Yeon Park, Seoul; Dong Su Lee, Seoul; Dong Il Chun, Seoul; Eui Joon Yoon, Seoul, all of Rep. of Korea

[73] Assignee: Tong Yang Cement Corporation, Seoul, Rep. of Korea

[21] Appl. No.: 09/003,058

[22] Filed: Jan. 5, 1998

[51] Int. Cl.[7] .................................................. H01L 21/44
[52] U.S. Cl. .............................. 438/3; 438/658; 438/661; 438/686
[58] Field of Search ........................................... 438/650, 686, 438/658, 660, 3, 661, 678, 679, 680, 681; 204/192.1, 192.15, 192.17

[56] References Cited

U.S. PATENT DOCUMENTS

| | | | |
|---|---|---|---|
| 4,028,657 | 6/1977 | Reichelt | 338/307 |
| 4,103,275 | 7/1978 | Diehl et al. | 338/25 |
| 4,129,848 | 12/1978 | Frank et al. | 338/308 |
| 4,253,931 | 3/1981 | Gold et al. | 204/192 SP |
| 4,375,056 | 2/1983 | Baxter et al. | 338/25 |
| 4,396,899 | 8/1983 | Ohno | 338/34 |
| 4,690,861 | 9/1987 | Nakamura et al. | 428/623 |
| 4,804,438 | 2/1989 | Rhodes | 156/653 |
| 4,952,904 | 8/1990 | Johnson et al. | 338/36 |
| 4,966,865 | 10/1990 | Welch et al. | 437/192 |
| 5,104,684 | 4/1992 | Tao et al. | 427/38 |
| 5,142,437 | 8/1992 | Kammerdiner et al. | 361/313 |
| 5,191,510 | 3/1993 | Huffman | 361/313 |
| 5,320,978 | 6/1994 | Hsu | 437/192 |
| 5,331,187 | 7/1994 | Ogawa | 257/295 |
| 5,348,894 | 9/1994 | Gnade et al. | 437/12 |
| 5,440,173 | 8/1995 | Evans, Jr. et al. | 257/751 |
| 5,453,294 | 9/1995 | Ogi et al. | 427/100 |
| 5,471,072 | 11/1995 | Papanicolaou | 257/77 |
| 5,498,569 | 3/1996 | Eastep | 437/187 |
| 5,508,953 | 4/1996 | Fukuda et al. | 365/145 |
| 5,512,151 | 4/1996 | Hayamizu et al. | 204/192.15 |
| 5,514,484 | 5/1996 | Nashimato | 428/700 |
| 5,650,202 | 7/1997 | Mammone et al. | 427/536 |
| 5,656,382 | 8/1997 | Nashimoto | 428/620 |
| 5,736,422 | 4/1998 | Lee et al. | 438/201 |
| 5,793,057 | 8/1998 | Summerfelt | 257/55 |
| 5,840,615 | 11/1998 | Aoki et al. | 438/396 |
| 5,846,859 | 12/1998 | Lee | 438/253 |

OTHER PUBLICATIONS

M. Hecq and A. Hecq, "Oxygen Induced Preferred Orientation of DC Sputtered Platinum," *J. Vac. Sci. Technol.,* vol. 18, No. 2, Mar. 1981, pp. 219–222.

R.C. Budhani et al., "Summary Abstract: Oxygen Enhanced Adhesion of Platinum Films Deposited on Thermally Grown Alumina Surfaces," *J. Vac. Sci. Technol. A,* vol. 4, No. 6, Nov./Dec. 1986,, pp. 3023–3024.

(List continued on next page.)

*Primary Examiner*—Wael Fahmy
*Assistant Examiner*—Kurt Eaton
*Attorney, Agent, or Firm*—Townsend & Townsend & Crew LLP

[57] ABSTRACT

A platinum film, which is used as a bottom electrode for a capacitor in a DRAM cell or a non-volatile ferroelectric memory cell, is formed in two separate processes, wherein a first thickness platinum part thereof is deposited under an inert gas atmosphere, and the second thickness platinum part is deposited under an atmosphere containing oxygen, nitrogen and/or a mixture thereof as well as an inert gas. The platinum film is annealed under a vacuum atmosphere to remove the oxygen an/or nitrogen introduced during the deposition of the second thickness platinum part. The annealed platinum film prevents formation of an oxide on a functional intermediate film such as a diffusion barrier layer or an adhesion layer, which is provided below the bottom electrode of platinum film.

28 Claims, 10 Drawing Sheets

OTHER PUBLICATIONS

K.H. Park, et al., "Microstructures and Interdiffusions of Pt/Ti Electrodes With Respect to Annealing in the Oxygen Ambient," *J. Mater. Res.,* vol. 10, No. 7, Jul. 1995, pp. 1790–1794.

G. Cui et al., "Epitaxial Growth of Pt(001) Thin Films on MgO(001) Under Oxidizing Conditions," *Mat. Res. Soc. Symp. Proc.,* vol. 310, 1993, pp. 345–350.

K. Kushida–Abdelghafar, "Pt/TiN Electrodes for Stacked Memory With Polysilicon Plug Utilizing PZT Films," *Integrated Ferroelectrics,* vol. 13, 1996, pp. 113–119.

D.E. Kotecki, "High–K Dielectric Materials for DRAM Capacitors," *Semiconductor International,* Nov. 1996, pp. 109–110 and 112, 114 and 116.

D.S. Lee et al., "Characterization of Platinum Films Deposited by a Two–Step Magnetron Sputtering on $SiO_2$/Si Substrates," (Oct. 8, 1997 printout from http://www.tycl.co.kr/eng/mrs2.htm) from Materials Research Society Fall Meeting 1996 in Boston, Massachusetts, Nov. 8, 1996, 6 pages.

M.H. Kim et al., "Stress of Platinum Films Deposited by DC Magnetron Sputtering Using Argon/Oxygen Gas Mixture," (Oct. 8, 1997 printout from http://www.tycl.co.kr/eng/mrs2.htm) from Materials Research Society Fall Meeting 1996 in Boston, Massachusetts, Nov. 8, 1996, 5 pages.

D.Y. Park et al., "(100) Orientation Platinum Thin Films Deposited by DC Magnetron Sputtering on $SiO_2$/Si Substrates," (Oct. 8, 1997 printout http://www.tycl.co.kr/eng/mrs2.htm) from Materials Research Society Fall Meeting 1996 in Boston, Massachusetts, Nov. 8, 1996, 5 pages.

K. Sreenivas et al., "Investigation of Pt/Ti Bilayer Metallization on Silicon for Ferroelectric Thin Film Integration," *J. Appl. Phys.,* vol. 75, No. 1, Jan. 1994, pp. 232–239.

B.S. Kwak et al., "Study of Epitaxial Platinum Films Grown by Metalorganic Chemical Vapor Depostion," *J. Appl. Phys.,* vol. 72, No. 8, 1992, pp. 3735–3740.

Staley, John, "Platinum Thin Films and Next–Generation Micromachined Sensors," *Sensors,* Apr. 1996, pp. 56–62.

H.N. Al–Shareef et al., "Electrodes for Ferroelectric Thin Films," *Integrated Ferroelectrics,* vol. 3, 1993, pp. 321–332.

P.D. Hren et al., "Bottom Electrodes for Integrated Pb(Zr, Ti)$O_3$ Films," *Integrated Ferroelectrics,* vol. 2, 1992. pp. 311–325.

G.A.C.M. Spierings et al., "Influence of Platinum–Based Electrodes on the Microstructure of Sol–Gel and MOD Prepared Lead Zirconate Titanate Films," *Integrated Ferroelectrics,* vol. 3, 1993, pp. 283–292.

G.A.C.M. Spierings et al., "Stresses in Pt/Pb(Zr,Ti)O3/Pt Thin–Film Stacks for Integrated Ferroelectric Capacitors," *J. Appl. Phys.,* vol. 78, No. 3, 1995, pp. 1926–1933.

D.H. Lee et al., "Microstructures and Pyroelectric Properties of (Pb,La)Ti$O_3$ Thin Films Grown on MgO and on Pt/MgO," *Integrated Ferroelectrics,* vol. 5, 1995, pp. 125–132.

Hitoshi Tabata et al., "C–axis Preferred Orientation of Laser Ablated Epitaxial PbTi$O_3$ Films and Their Electrical Properties," *Appl. Phys. Lett.,* vol. 64, No. 4, 1994, pp. 428–430.

P.C. McIntyre et al., "Orientation Selection and Microstructural Evolution of Epitaxial Pt Films on (001) MgO," *Mat. Res. Soc. Symp. Proc.,* vol. 355, 1995, Symposium held Nov. 28–Dec. 2, 1994 in Boston, Massachusetts, pp. 335–340.

R. Ramesh et al., "Oriented Ferroelectric La–Sr–Co–O/Pb–La–Zr–TiO/La–Sr–Co–O Heterostructures on (001) Pt/Si$O_2$ Si Substrates Using a Bismuth Titanate Template Layer," *Appl. Phys. Lett.,* vol. 64, No. 19, 1994, pp. 2511–2513.

R. Moazzami, "Ferroelectric Thin Film Technology for Semiconductor Memory," *Semicond. Sci. Technol.,* vol. 10, 1995, pp. 375–390.

M. Otsu et al., "Preparation PZT Film on (100)Pt/(100)MgO Substrate by CVD and its Properties," *J. Ceram. Japan,* vol. 102, No. 2, 1994, pp. 126–132.

B.A. Tuttle et al., "Highly Oriented, Chemically Prepared Pb(Zr,Ti)$O_3$ Thin Films," *J. Am. Ceram. Soc.,* vol. 76, No. 6, 1995, pp. 1537–1544.

Keiko Kushida–Abdelghafar, Masahiko Hiratani, Kazuyoshi Torii, and Yoshihisa Fujisaki, "Pt/TiN Electrodes for stacked Memory With Polysilicon Plug Utilizing PZT Films," *Integrated Ferroelectrics,* 1996, vol. 13, pp. 113–119.

← Pt
← TiN
← Poly-Si

APPARATUS AND METHODS OF DEPOSITING A PLATINUM FILM WITH ANTI-OXIDIZING FUNCTION OVER A SUBSTRATE

CROSS-REFERENCE TO RELATED APPLICATIONS

This application claims priority from commonly-assigned Republic of Korea Application Serial No. P97-969 (filed Jan. 15, 1997).

BACKGROUND OF THE INVENTION

The present invention relates to a technique for depositing a platinum film, which is used as a bottom electrode of a capacitor in a high density DRAM and in a non-volatile memory cell including a FRAM memory cell. More particularly, the invention relates to a technique of forming a platinum film which can prohibit oxidation of a functional intermediate film (e.g., such as a diffusion barrier layer of a high density DRAM) which is provided below the platinum film.

In this specification, the term "functional intermediate film" is used to cover all of the films used in electronic devices for prohibiting inter-diffusion of silicon in a polysilicon layer and platinum in a platinum electrode, for electric connection or insulating, and/or for enhancing adhesion between a platinum film and a substrate. As well-known in the art, a functional intermediate film may be referred to as a "diffusion barrier layer," a "conductive plug layer," an "adhesion layer," or an "insulation layer" in accordance with its function. Due to the presence of these layers, some problems can arise.

For example, a platinum film is usually used as a bottom electrode in a capacitor of a high density DRAM cell or of a non-volatile ferroelectric memory device. In this regard, when the platinum film is served as a bottom electrode of a capacitor in a DRAM cell and a transistor is connected to the capacitor via a conductive plug formed from polysilicon, platinum silicide is formed on the interface between the polysilicon layer and the platinum film during the platinum depositing, subsequent annealing and/or the other post-processing, since the platinum film directly contacts the polysilicon layer. To avoid this phenomenon, a diffusion barrier layer formed from a nitride (e.g., such as TiN, Ti—Si—N and GaN) is formed between the platinum film and the polysilicon.

Even if a diffusion barrier layer is formed, oxygen gas introduced during the post-annealing or high-dielectric/ferroelectric oxide layer depositing process can diffuse through voids formed between grain boundaries in the platinum film. Because the grains of the platinum film deposited by conventional processes have vertical columnar structures with inter-columnar voids, oxygen introduced from the above-mentioned process can easily diffuse through the platinum film to the diffusion barrier layer. The oxygen gas diffused through the platinum film then oxidizes the diffusion barrier layer and forms an oxidized insulation layer such as $TiO_2$ and $Ta_2O_5$ between the barrier layer and the platinum film. Consequently, the function of the platinum film as an electrode can become deteriorated or even lost. In particular, if the diffusion barrier layer is formed from TiN, $N_2$ gas is produced while an oxidized film of $TiO_2$ is formed on the surface of TiN layer, and the $N_2$ gas can cause the platinum to expand and become released from the barrier layer. This phenomenon is known as "buckling."

In a DRAM device or a non-volatile memory device or various types of sensor devices, a functional intermediate film, more particularly a conductive adhesion layer, formed from Ti, Ta, TiN, TiW or W also can be interposed between the substrate (or a insulation layer formed on the substrate) and the platinum film in order to increase adhesion strength therebetween. In this case, although a ferroelectric oxide film is deposited after the adhesion layer and the platinum film have been formed, oxygen gas and/or adhesion layer material can diffuse through the platinum film formed by conventional methods, thereby forming an insulation layer such as $TiO_2$ and $Ta_2O_5$ in a DRAM cell due to the oxidizing of the adhesion layer. Moreover, "buckling" of the platinum film may occur if TiN was used, since $N_2$ is generated due to the oxidation of TiN to $TiO_2$. Therefore, the performance properties of a DRAM cell or a non-volatile ferroelectric cell or other device can be extremely deteriorated due to problems caused by oxygen diffusing through the platinum film and resulting in oxidation.

As known in the art, if the platinum film employed as a bottom electrode has (200) preferred orientation, the ferroelectric oxide film which is formed on the platinum film tends to be oriented mostly to one crystallographic direction, preferably to the c-axis direction. Due to this controlled orientation, it has been found that the electrical properties of the electronic device can be highly improved, while its fatigue tendency can be reduced and adhesion strength improved. Therefore, the orientation control of platinum film can be very important.

In addition, platinum films formed by the conventional methods using sputtering often are not dense enough and may have a number of pinholes, pores or hillocks, which may result in device performance problems.

It is seen from the above that methods for forming platinum films that can prevent oxidation of a functional intermediate film (such as a diffusion barrier layer, an adhesion layer, an insulation layer, and a conductive plug layer) are desirable. It is also desirable to be able to control the orientation of such platinum films and have defect-free platinum films.

SUMMARY OF THE INVENTION

According to various specific embodiments, the present invention provides a method of forming a platinum film which can prevent the oxidation of a functional intermediate film, and a method of manufacturing a semiconductor device using comprising a platinum film as a bottom electrode which can prevent the oxidation of the functional intermediate film.

According to one specific embodiment, the present invention provides a method of forming a platinum film over a functional intermediate film formed on a substrate comprising steps of: depositing a platinum film over the functional intermediate film in two depositing processes, wherein a first thickness platinum part thereof is first deposited under an inert gas atmosphere and then the second thickness platinum part thereof is deposited under an atmosphere containing oxygen and/or nitrogen together with an inert gas; and annealing the platinum film under a vacuum atmosphere to remove the oxygen and/or nitrogen introduced during the deposition of the second thickness platinum part. The term, "atmosphere containing oxygen and/or nitrogen" means an atmosphere including at least one of: $O_2$, $O_3$, $N_2$, $N_2O$ or a mixture thereof.

According to another specific embodiment, the present invention provides a method for manufacturing an electronic device comprising steps of: providing a substrate; depositing a functional intermediate film over the substrate; depositing a platinum film over the functional intermediate film, wherein a first thickness platinum part thereof is firstly deposited under an inert gas atmosphere and then the second thickness platinum part thereof is deposited under an atmosphere containing oxygen and/or nitrogen together with an inert gas; annealing the platinum film under a vacuum atmosphere to remove the oxygen and/or nitrogen introduced during the deposition of the second thickness platinum part; and forming a high-dielectric or ferroelectric oxide film on the platinum film. In order to protect the functional intermediate layer from oxidation during the deposition of the second thickness platinum part, it is desirable to maintain the ratio of the thickness of the first thickness platinum part to the total thickness of the platinum film to be deposited in the range between 5% and 50%.

The present invention along with its features and advantages will now be explained in detail with reference to the attached drawings illustrating specific embodiments of the present invention.

DETAILED DESCRIPTION OF THE SPECIFIC EMBODIMENTS

Figure 1A:
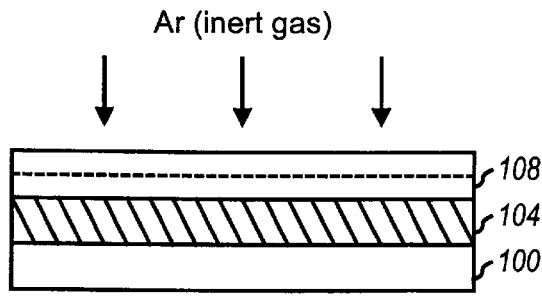
FIGS. 1a to 1d are schematic cross-sectional views of illustrating the steps of manufacturing a semiconductor device comprising a platinum film first deposited under an inert gas atmosphere and then under an atmosphere containing oxygen, in accordance with a specific embodiment of the present invention.

In particular, various specific embodiments of the present invention are generally described below in relation to FIGS. 1a to 1d and FIGS. 2a–2c. In these specific embodiments, the present invention provides methods of forming a platinum film which can prevent the oxidation of a functional intermediate film. An inert gas can be selected from Ar, Ne, Kr or Xe, in accordance with specific embodiments. The present invention can be applied to a process manufacturing an electronic device. In some embodiments, a ferroelectric film may be formed on the platinum film, with the platinum film functioning, for example, as a bottom electrode. In some specific embodiments, depending on types of electronic devices to which the platinum film is applied, a functional intermediate film (such as an insulation layer, a conductive plug, an adhesion layer, or a diffusion barrier layer) may be provided between the platinum film and the substrate. Various materials which may be used for the different films are discussed in detail below and have general applicability to the following description of the specific embodiments.

The material of the substrate may be selected from one of the following groups: single component semiconductor materials, e.g., silicon (Si), germanium (Ge) and diamond (C); compound semiconductor materials, e.g., GaAs, InP, SiGe and SiC; ceramic single crystals, e.g., SrTiO$_3$, LaAlO$_3$, Al$_2$O$_3$, KBr, NaCl, MgO, ZrO$_2$, Si$_3$N$_4$, TiO$_2$, Ta$_2$O$_5$, AlN or ceramic poly-crystals thereof; metals, e.g., Au, Ag, Al, Ir, Pt, Cu, Pd, Ru, W; and amorphous/glassy materials, e.g., BSG, PSG, BPSG, Si.

As mentioned above, a functional intermediate film such as an insulating layer, a conductive plug layer, a diffusion barrier layer, or an adhesive or glue layer is formed between the platinum film and the substrate. The materials used for a functional intermediate film functioning as an insulating layer include SiO$_2$, Si$_3$N$_4$, BPSG, MgO, CaO, CaF$_2$, Al$_2$O$_3$ or B$_2$O$_3$. The materials used for a functional intermediate film functioning as a conductive plug layer include TiN, zirconium nitride, titanium silicide, tantalum silicide, tungsten silicide, molybdenum silicide, nickel silicide, cobalt silicide, tantalum carbide, tantalum boride, polysilicon, germanium, W, Ta, Ti, Mo, TiW, boron carbide, Cu and the like. The material used for a functional intermediate film which functions as a diffusion barrier layer can be selected from any one of the following groups: ternary component amorphous materials (Ti—Si—N, Ta—B—N, Ti—B—N), conductive nitride (titanium aluminum nitride, Zr nitride, Hf nitride, Y nitride, Se nitride, La nitride, rare earth nitride, N deficient Al nitride, doped Al nitride, Mg nitride, Ca nitride, Sr nitride, Ba nitride, TiN, GaN, Ni nitride, Ta nitride, Co nitride, W nitride, and the like. The materials used for a functional intermediate film used for an adhesion or glue layer include TiN, W, Ta, Ti, Sn, Ru, In, Ir, Os, Rh, and silicide compound (Ni silicide, Co silicide, W silicide).

According to some specific embodiments, the present invention also forms a high-dielectric or ferroelectric oxide film on the top surface of a platinum film after depositing the platinum film. For example, material used for the high dielectric film or the ferroelectric film may be selected from any one of the following groups: a perovskite structure oxide, such as BT(BaTiO$_3$), BST(Ba$_{1-x}$Sr$_x$TiO$_3$), ST(SrTiO$_3$), PT(PbTiO$_3$), PZT(Pb(Zr, Ti)O$_3$, PLT(Pb$_{1-x}$TiO$_3$), PLZT(x/y/zPb$_{1-x}$La$_x$)(ZyTiz)$_{1-x/4}$O$_3$, PMN(PbMg$_{1/3}$Nb$_{2/3}$O$_3$), LiTaO$_3$, KNbO$_3$, K(Ta, Nb)O$_3$, CaTiO$_3$, SrSnO$_3$, NaNbO$_3$, LaAlO$_3$, YAlO$_3$ and KMGF3; a bismuth-layered perovskite structure oxide, such as SrBiNbO$_9$, SrBi$_2$Ti$_2$O$_9$, SrBi$_2$Ta$_2$O$_9$, SrBi$_2$(Ta$_x$Nb$_{1-x}$)$_2$O$_9$ and Bi$_4$Ti$_3$O$_{12}$); a tungsten-bronze type structure oxide such as Sr$_{1-x}$Ba$_x$Nb$_2$O$_6$, (Sr, Ba)$_{0.8}$R$_x$Na$_{0.4}$Nb$_2$O$_6$(R; Cr, Zn, Y), (Pb, Ba)Nb$_2$O$_6$, (K, Sr)Nb$_2$O$_6$, (Pb, K)Nb$_2$O$_6$), Pb$_2$KNb$_5$O$_{15}$, $K_3Li_2Nb_5O_{15}$, and $(K, Na)_3Li_2Nb_5O_{15}$, $K_2LiNb_5O_{15}$; $ReMnO_3$ (where Re is a rare-earth element); and $BaMF_4$ (where M is Mn, Co, Mg, or Zn).

In accordance with the present invention, the platinum film may be deposited by employing any one of the following methods: the DC/RF magnetron sputtering, DC/RF sputtering, metal organic chemical vapor deposition, partially ionized beam deposition, vacuum evaporation, laser ablation and electroplating.

As discussed below, it has been observed that the platinum film formed by the present invention has two important characteristics. First, it has been found that the platinum film has a dense microstructure. Second, the platinum film formed in accordance with the present invention does not have pores and/or hillocks. In this dense platinum film without pores and/or hillocks, the oxygen can not easily diffuse through the platinum film to the functional intermediate layer. This is because the platinum film according to the present invention has an absence of voids between the grain boundaries which are likely to exist in a platinum film with a columnar structure, such as formed with prior art methods. Microstructures shown by transmission electron microscopy reveal the non-columnar, intricate grain boundary configuration provided by the complex granular structure of platinum film formed by the methods according to the present invention. As a result of the grain structure, the platinum films formed by the present invention can serve as oxidation barriers for preventing the oxidation of the functional intermediate film. Furthermore, due to their well-enhanced oxygen blocking function, the platinum films according to the present invention can inhibit the buckling phenomenon, such as caused by the nitrogen gas generated by the oxidation of the functional intermediate film formed from TiN in accordance with the prior art platinum film deposition methods.

In addition, it has been observed that the preferred orientation of the platinum film of the present invention can be controlled by changing at least one of the following parameters: partial pressure ratios of oxygen, nitrogen and the mixture thereof to the entire gas in the atmosphere employed in depositing the second thickness platinum part of the platinum film; the temperature of the substrate during the deposition step; the annealing temperature; and the ratio of the thickness of the first thickness platinum part to the total thickness of the platinum film to be deposited.

In accordance with some specific embodiments of the present invention, the platinum depositing step can be performed in three or more separate processes for even more precise control of the dimension and/or properties of the platinum film. As already mentioned above, the preferred orientation of the platinum film can be controlled by one or more factors among: the partial pressure ratios of oxygen, nitrogen and/or mixture thereof to the total deposition atmosphere gases in the atmosphere for depositing the second thickness platinum part (or subsequent parts) of the platinum film; the temperature of the substrate during the deposition process; the annealing temperature; and the ratio of the thickness of the first thickness platinum part to the total thickness of the platinum film.

According to the present invention, it is possible to manufacture an electronic device comprising a bottom electrode of defect-free platinum film which prevents the oxidation of the functional intermediate film disposed under the bottom electrode and has controlled orientation.

FIGS. 1a to 1d show steps of manufacturing a semiconductor device comprising a platinum film deposited on a substrate 100 according to a specific embodiment of the present invention. Referring to FIG. 1a, a functional intermediate film 104 (such as diffusion barrier layer, insulation layer, conductive plug layer or adhesion layer) is formed over substrate 100, and a platinum layer 108 is deposited on the functional intermediate film 104 to a first thickness under an inert gas atmosphere such as argon. As mentioned above, the inert gas also may be selected from Ne, Kr, Xe, etc. The first deposited layer 108 of the platinum film is referred to as "first thickness platinum part" or "first thickness part of the platinum film."

Figure 1B:
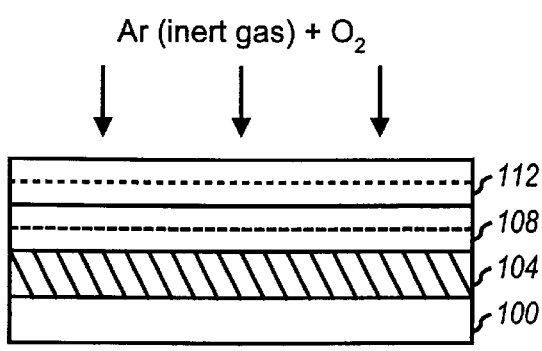

Following this, another platinum layer 112 is deposited directly on the first platinum layer 108 to a second thickness under an atmosphere containing oxygen components, as shown in FIG. 1b. This platinum layer is referred to as "second thickness platinum part" or "second thickness part of the platinum film."

Figure 1C:
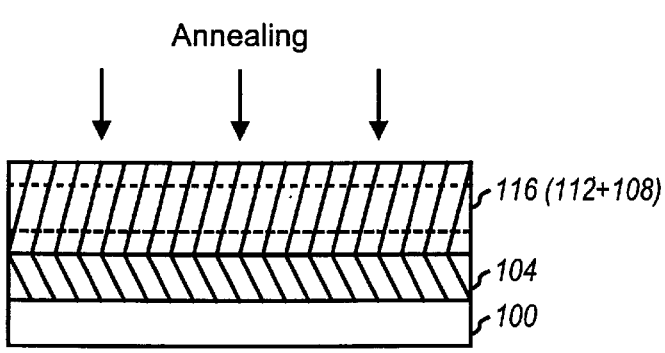
Figure 1D:
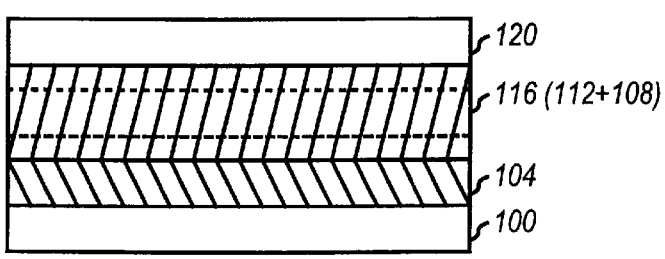

After depositing the second thickness platinum part 112, both parts of the platinum film, 108 and 112, are annealed at a temperature of about 400° C. to about 700° C. to remove oxygen components. As a result of this process, the platinum film 108 and 112 are changed to a platinum layer 116 substantially free of the oxygen component (FIG. 1c). For clarity, the platinum layer 116 will also be referred as the "annealed platinum film." As can be understood from the above, the annealed first thickness part 108 and the annealed second thickness part 112 will form a platinum film 116 to serve as a bottom electrode in an electronic device.

In manufacturing an electronic device such as capacitor, it is possible to form a high-dielectric or ferroelectric oxide film 120 on the top surface of the annealed platinum film 116, after the platinum film 116 is formed as a bottom electrode, and then to deposit a conductive film, preferably a platinum film, over the oxide film 120 to serve as a top electrode of the electronic device.

In the platinum film 116 serving as a bottom electrode, the first thickness platinum part 108 can be formed to a thickness so that it can prevent oxygen, which may be introduced during depositing the second thickness platinum part, from diffusing to the functional intermediate film through the first thickness platinum part. In this regard, the first thickness platinum part can be deposited to a thickness for appropriately blocking the oxygen diffusion to the functional intermediate layer. For example, the first thickness part 108 may be very thin to the extent of 5% of total thickness of the platinum film 116.

Meanwhile, the annealed platinum film 116 can have (200), (111), (220), or mixed {(111), (200) and/or (220)} preferred orientation. As can be seen from the experimental data to be explained hereinbelow, the preferred orientation can be controlled by changing one or more factors among: the partial pressure ratios of oxygen, nitrogen and/or mixture thereof to the total deposition atmosphere gases in the atmosphere for depositing second thickness platinum part of the platinum film; the temperature of the substrate during the deposition process; the annealing temperature; and the ratio of the thickness of the first thickness platinum part to the total thickness of the platinum film. In connection with controlling the preferred orientation of an annealed platinum, it is preferred that the thickness of the first thickness part 108 does not exceed 50% of the total platinum film serving as a bottom electrode.

Figure 2A:
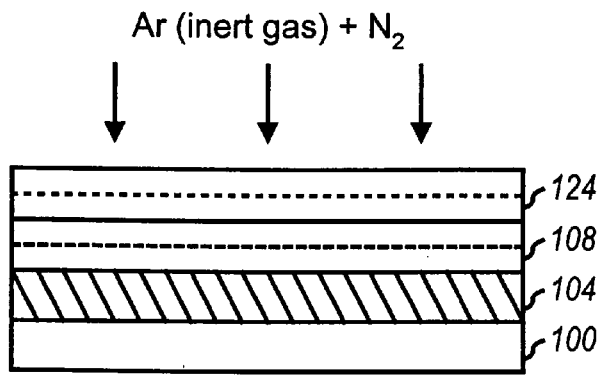
FIGS. 2a to 2c are schematic cross-sectional views of diagrams illustrating modifications to the method of FIGS. 1a to 1d, according to other specific embodiments of the present invention.
Figure 2B:
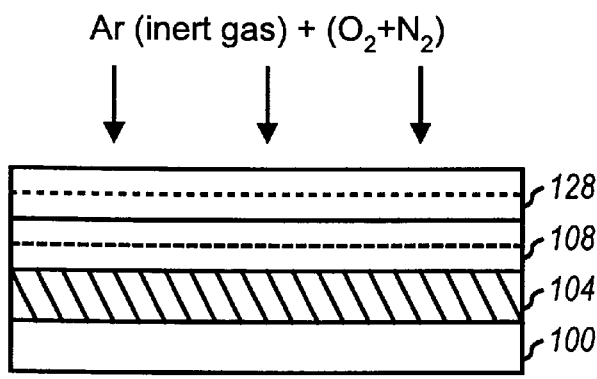
Figure 2C:
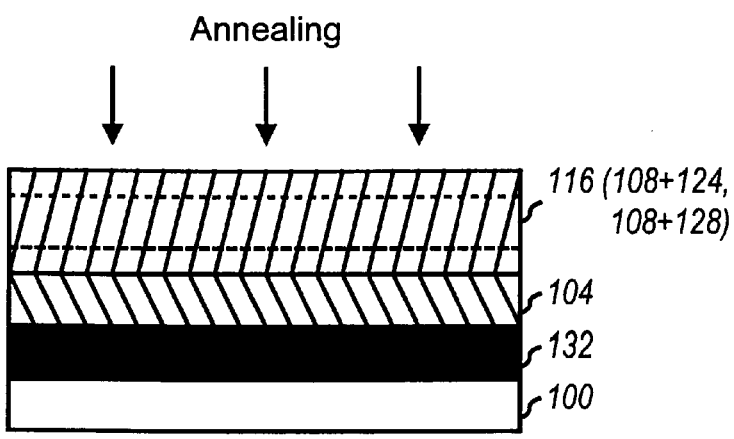

In accordance with other specific embodiments of the present invention, FIGS. 2a to 2c show modified methods to those of FIGS. 1a to 1d. Similarly as in FIGS. 1a, the functional intermediate film 104 (such as diffusion barrier layer, insulation layer, conductive plug layer or adhesion layer) is formed over substrate 100, and the first thickness platinum part 108 is deposited on the functional intermediate film 104 to a first thickness under an inert gas atmosphere such as argon. As mentioned above, the inert gas also may be selected from Ne, Kr, Xe, etc. Following the steps of FIG. 1a, a second thickness platinum part 124 is deposited directly on the first platinum layer 108 to a second thickness under an atmosphere containing inert gas and nitrogen gas, as shown in the embodiment of FIG. 2a. Alternatively, following the steps of FIG. 1a, a second thickness platinum part 128 is deposited directly on the first platinum layer 108 to a second thickness under a deposition atmosphere containing inert gas and a mixture of nitrogen gas and oxygen gas, as shown in the embodiment of FIG. 2b. Then, both parts of the platinum films (108 and 124 for the embodiment of FIG. 2a, or 108 and 128 for the embodiment of FIG. 2b) are annealed to remove nitrogen and/or oxygen therefrom. Similarly as for FIG. 1c, the reference numeral 116 indicates the annealed platinum film, which is substantially free of nitrogen and/or oxygen after annealing in the various specific embodiments. Following the annealing, a high-dielectric or a ferroelectric oxide film is deposited on the annealed platinum film 116, i.e., on the top surface of the bottom platinum electrode, similar to FIG. 1d. According to another specific embodiment, as can be seen from FIG. 2c, it is possible to form an insulation layer 132 on the substrate 100 before depositing the functional intermediate film 104 to insulate the substrate 100 and the functional intermediate film 104. The insulation layer 132 can be formed from any one of: $SiO_2$, $Si_3N_4$, BPSG, MgO, CaO, $CaF_2$, $Al_2O_3$, $B_2O_3$, BSG, PSG and the like insulating materials.

Description of Exemplary Integrated Circuit Devices

Figure 3A:
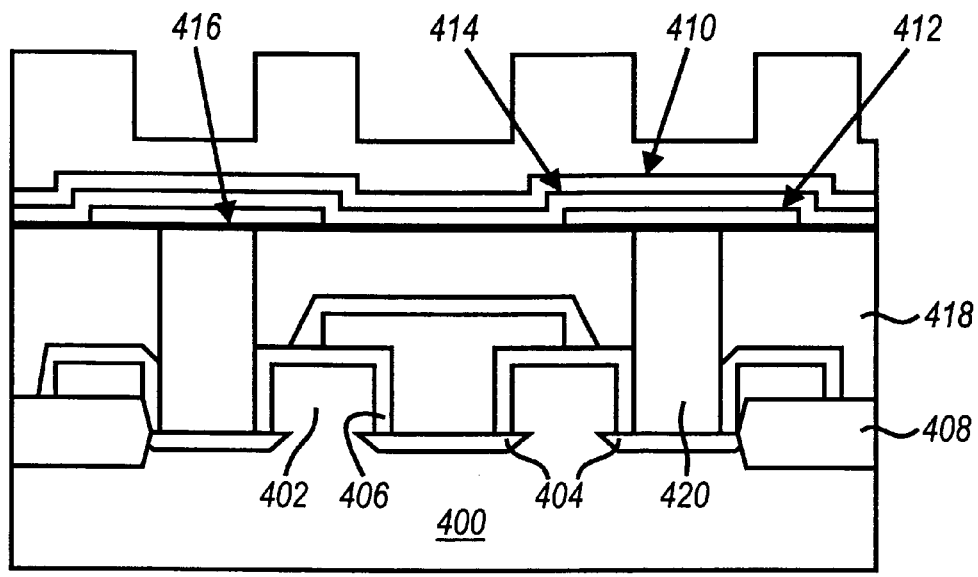
FIG. 3a is a schematic cross-sectional view showing a high density DRAM, in accordance with a specific embodiment of the present invention.

FIG. 3a represents a schematic diagram of an exemplary integrated circuit device, such as a DRAM cell with high dielectric capacitors, which may be fabricated in accordance with the present invention. As seen in FIG. 3a, formed in the DRAM cell region of a substrate 400 is a transistor having a gate electrode 402 and source/drain regions 404. Gate electrode 402, which may be formed with doped or undoped polysilicon, is capped with a sidewall oxide layer 406, and field oxide 408 provides isolation. Also formed in the DRAM cell region is a high dielectric capacitor. The capacitor includes an upper capacitor cell plate 410, a bottom capacitor storage node 412, and a high dielectric constant material 414 formed between plate 410 and node 412. The capacitor is isolated from the transistor by an insulating layer 418, except through vias through layer 418 which are filled with a polysilicon plug layer 420. Insulating layer 418 may be made of $SiO_2$, BPSG, etc. A diffusion barrier layer 416 is formed between bottom capacitor storage node 412 and polysilicon plug 420. As discussed above, the present invention may be used to deposit orientation-controlled platinum for use as bottom capacitor storage node 412 and/or upper capacitor cell plate 410. For example, as illustrated in FIG. 3a, a bottom electrode of platinum film 412 may be deposited on the top surface of diffusion barrier layer 416 which is formed on the conductive plug layer 420 of polysilicon in order to prevent formation of silicide between the polysilicon plug layer 420 and the platinum electrode 412 in a DRAM memory cell.

Figure 3B:
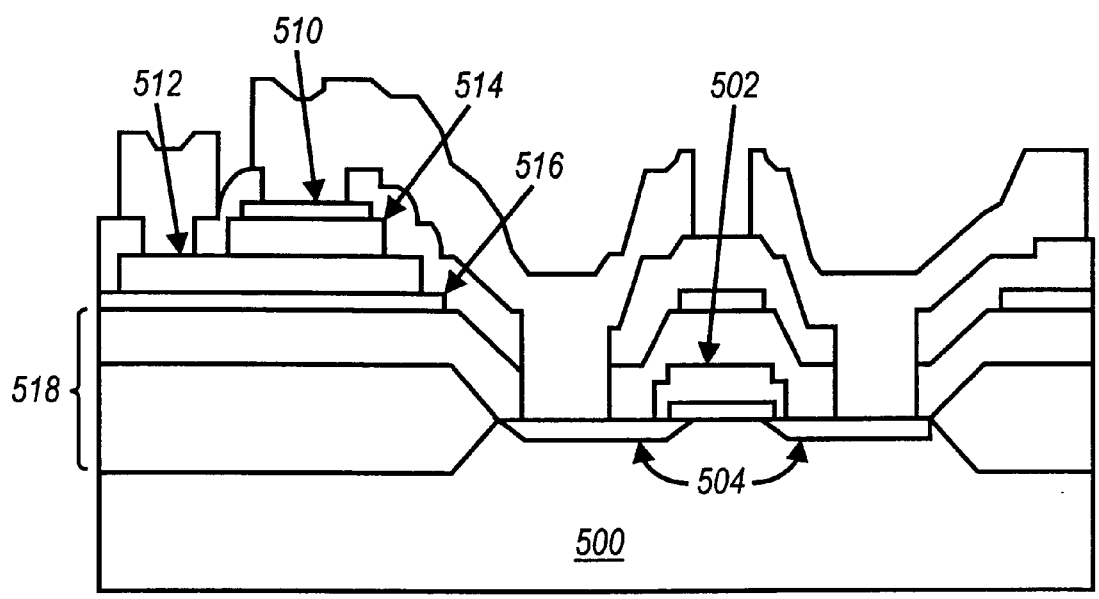
FIG. 3b is a schematic cross-sectional view showing a non-volatile ferroelectric memory device, in accordance with another specific embodiment of the present invention.

FIG. 3b represents a schematic diagram of an exemplary integrated circuit device, such as a non-volatile ferroelectric memory device, which may also be fabricated in accordance with the present invention. As seen in FIG. 3b, formed in the cell region of a substrate 500 is a transistor having a gate electrode 502 and source/drain regions 504. Also formed in the non-volatile ferroelectric memory device is a ferroelectric capacitor. The capacitor includes a top capacitor electrode 510, a bottom capacitor electrode 512, and a ferroelectric material 514 (e.g., PZT) formed between electrodes 510 and 512. Formed underneath the bottom capacitor electrode 512 is a buffer layer 516 (e.g., $TiO_2$) formed over an insulating layer 518 on substrate 500. As discussed above, the present invention may be used to deposit orientation-controlled platinum with good adhesion strength for use as bottom electrode 512 and/or upper electrode 510.

FIGS. 3a and 3b are merely representative examples of integrated circuit devices which may be fabricated in accordance with specific embodiments of the present invention. Other devices also may be fabricated in accordance with other specific embodiments.

Description of Exemplary Substrate Processing Apparatus

In accordance with the present invention, the platinum film may be deposited by employing any one of the following methods: the DC/RF magnetron sputtering, DC/RF sputtering, metal organic chemical vapor deposition, partially ionized beam deposition, vacuum evaporation, laser ablation and electroplating.

Figure 4:
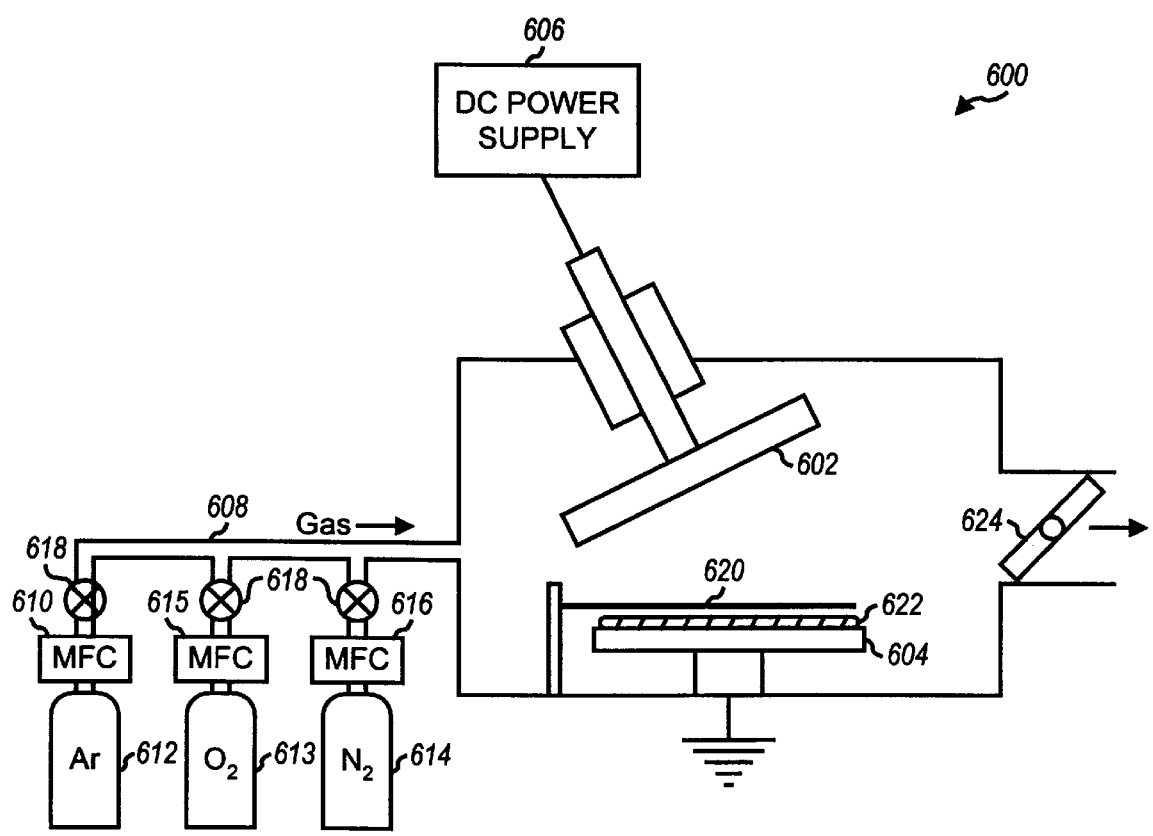
FIG. 4 is a simplified diagram illustrating an exemplary substrate processing apparatus which may be used in accordance with a specific embodiment of the present invention.

FIG. 4 is a simplified diagram illustrating an exemplary substrate processing apparatus, such as a DC sputtering apparatus 600, which may be used in accordance with a specific embodiment of the present invention. In the exemplary sputter deposition system of FIG. 4, a platinum target 602 (a plate of the platinum material that is to be deposited) is connected to a DC power supply 606 (alternatively, in a RF sputtering system, target 602 is connected to a RF power supply) at a negative voltage and about 100 Watt to 200 Watt power while a substrate holder 604 facing target 602 is grounded (as seen in the specific embodiment of FIG. 4) or/and heated by a heater under substrate holder 604. In specific embodiments, platinum target 602 may be a 2 inch, 4 inch or 6 inch diameter target for a 2 inch, 4 inch or 6 inch diameter substrate, respectively. In the specific embodiments discussed below, a 4 inch diameter was used for target 602 and the substrate. An inert gas, such as argon in the specific embodiment, is flowed through a gas line 608 at a rate controlled by a mass flow controller 610 into the system from an argon source 612. As mentioned earlier, an inert gas can be selected from Ar, Ne, Kr or Xe, in accordance with various specific embodiments. In embodiments where nitrogen is used, nitrogen also is flowed from a nitrogen source 614 through gas line 608 at a rate controlled by a mass flow controller 616. In embodiments where oxygen is used, oxygen also is flowed from an oxygen source 613 through gas line 608 at a rate controlled by a mass flow controller 615. In the specific embodiment, valves 618 are also used for inert gas source 612, oxygen source 613 and nitrogen source 614. In the specific embodiment, the system is typically maintained at a basic pressure on the order of about $10^{-6}$ Torr using an exhaust valve 624, to provide a medium in which a glow discharge can be initiated and maintained. When the glow discharge is started, positive ions strike target 602, and target platinum atoms are removed by momentum transfer. When a sliding shutter 620 is adjusted to expose substrate holder 604, these target platinum atoms subsequently condense into a thin platinum film on a substrate 622, which is on substrate holder 604. Target 602 and substrate holder 604 are tilted to each other by about 30° in the specific embodiment. Substrate holder 604 rotates during sputter deposition for obtaining uniform platinum film deposition over substrate 622 at a rotating speed of about 3 revolutions per minute (rpm), according to the specific embodiment. Prior to sputter deposition, substrate 622 was loaded using a magnetic bar into system 600 through a load lock chamber (not shown) coupled to the main chamber containing substrate holder 604. During sputter deposition, the total gas pressure within the main chamber of system 600 is controlled to a set value by exhaust valve 624, which is connected to a pumping system (not shown). Exhaust valve 624 also controls the flow of exhaust from system 600. It is noted that no auxiliary electrode is required with the exemplary sputtering deposition system 600 in order to deposit a preferred orientation-controlled platinum film onto substrate 622, which is a silicon substrate in the specific embodiment. For some embodiments, a magnetron gun may also be used to provide DC/RF magnetron sputtering.

Description of Exemplary Anti-oxidation Platinum Deposition Processes

In accordance with the present invention, exemplary processing conditions for sputter depositing anti-oxidation platinum using an inert gas, such as argon in the specific embodiment, and an oxygen and/or nitrogen deposition atmosphere are described as follows. In the specific embodiments, the platinum film with anti-oxidation properties is deposited in two steps: (i) a first thickness platinum part is deposited under an inert gas atmosphere, such as argon; and (ii) a second thickness platinum part is deposited under an atmosphere of an inert gas mixed with oxygen and/or nitrogen gas. The platinum film of the first and second thickness platinum parts is then annealed in a vacuum chamber in order to prevent the functional intermediate layer formed beneath the platinum film from oxidizing during the annealing. After vacuum annealing, the platinum film becomes sufficiently dense that it can act as an anti-oxidation barrier for the functional intermediate layer beneath it, even at high temperatures up to at least about 650° C. under an oxidizing atmosphere.

Since the platinum film in accordance with the present methods has a dense microstructure without any voids or hillocks, oxygen gas cannot diffuse through the platinum film to the functional intermediate film. Thus the oxidation of the functional intermediate film can be prevented with the present invention. Furthermore, even if the functional intermediate film is formed from TiN, the buckling phenomenon is not caused since nitrogen gas, which might otherwise be generated when TiN film is oxidized, is not generated at all. The fact that no oxidized insulation film is formed can be demonstrated by inspecting the cross-sectional surface of an electronic device incorporating the platinum film with electron microscopy or by measuring contact electric resistance of the platinum film.

It has been also observed that the preferred orientation {(111), (200), and/or (220)} of the platinum films can be easily controlled by changing at least one of the following parameters: partial pressure ratios of oxygen, nitrogen and/or oxygen-nitrogen mixture to the total gas pressure of the atmosphere used in depositing the second thickness platinum part; the substrate temperature during the platinum deposition step; and annealing temperature. Furthermore, the preferred orientation also can be changed by varying the ratio of the thickness of the first thickness platinum part to the total thickness of the platinum film.

In accordance with specific embodiments, the preferred conditions for forming anti-oxidation platinum include: the thickness ratio of the first thickness platinum part to the total thickness of the platinum film is about 5% to about 50%, the substrate temperature is about room temperature to about 500° C., the oxygen and/or nitrogen partial pressure ratio to the total pressure during the sputter deposition of the second thickness platinum part is about 3% to about 30%, and the temperature of vacuum annealing is about 250° C. to about 700° C.

It is noted that the values of these process variables may not be universal (i.e., the value of a certain variable to achieve some property of the film may vary according to the specific substrate processing apparatus used). For example, these variables may vary depending on the geometrical factors of chamber volume, target-substrate distance and other properties, such as the magnetic field intensity of the magnetron gun if a magnetron sputtering apparatus is used.

EXPERIMENTAL RESULTS

The advantages and effects of the present invention will now be explained in detail with reference to the examples which illustrate the procedures and conditions of tests performed, and with reference to results from prior art methods.

Example No. 1

A polysilicon layer was formed on a substrate (silicon wafer), and then a TiN film which serves as a diffusion barrier layer was deposited on the polysilicon layer. Following this, a platinum film of 2000 Å total thickness was formed on the TiN film in two separate steps using following method and conditions.

Deposition method employed: DC/RF magnetron sputtering

Basic pressure: $1\times10^{-6}$ Torr

Wafer rotating speed: 3.5 rpm

First deposition step of platinum film
   atmosphere: Ar
   substrate temperature: 300° C.
   deposition thickness: 600 Å (600 Å/2000 Å=30% total thickness)

Second deposition step of platinum film
   deposition atmosphere: Ar+$O_2$ (partial pressure ratio of $O_2$: 6%)
   deposition thickness: 1400 Å (1400 Å/2000 Å=70% total thickness)

Annealing condition: $5\times10^{-6}$ Torr vacuum, 600° C. for 1 hour

Example No. 2

Deposition of platinum film was performed under the same condition as in the Example No. 1 except that the partial pressure ratio of $O_2$ was increased to 10%, the first deposition thickness was 150 Å (150 Å/2000 Å=7.5% total thickness), and the second deposition thickness was 1850 Å (1850 Å/2000 Å=92.5% total thickness).

Example No. 3

Deposition of platinum film was performed under the same condition as in the Example No. 1 except that the partial pressure ratio of $O_2$ was increased to 14%.

Example No. 4

All of the conditions were the same with those in Example No. 1 except that $N_2$ was used in the atmosphere for depositing the second deposition part of the platinum in place of $O_2$, and the partial pressure ratio of $N_2$ was 6%.

Example No. 5

Except that the annealing temperature was changed to 500° C., the other conditions were the same with those in Example No. 4.

Example No. 6

Except that oxygen-nitrogen mixture was used in place of $O_2$ in the atmosphere for depositing the second thickness part of the platinum, the other conditions were the same with those in Example No. 1.

Example No. 7

First, an insulation layer of $SiO_2$, was formed on a substrate (silicon wafer) and then a TiN adhesion layer was formed on the $SiO_2$ layer. Following this, a platinum film of 2000 Å total thickness was deposited in two steps.
Deposition method, basic vacuum pressure, and wafer rotating speed employed in this example were the same with those in Example No. 1.

First deposition step of platinum film
  deposition atmosphere: Ar
  substrate temperature: 200° C.
  first deposition thickness: 150 Å (150 Å/2000 Å=7.5% total thickness)
Second deposition step of platinum film
  substrate temperature: 300° C.
  second deposition thickness: 1850 Å (1850 Å/2000 Å=92.5% total thickness)
Annealing conditions: $5 \times 10^{-6}$ Torr, 650° C. for 1 hour Example No. 8

A platinum film was formed on a substrate in the same method as that of Example No. 1. The deposition conditions were as follows.

Figure 5A:
FIG. 5a and FIGS. 5b to 5c are transmission electron microscopic photographs showing platinum films formed, respectively, by a prior art method and the method of Example No. 2 in accordance with a specific embodiment.
Figure 5B:
Figure 5C:
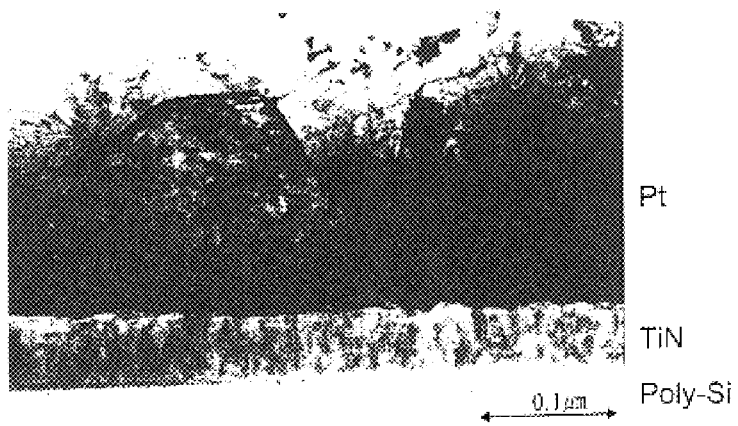

Deposition method: DC/RF magnetron sputtering
Basic pressure: $1 \times 10^{-6}$ Torr
Wafer rotating speed: 3.5 rpm
First deposition step of platinum film
  atmosphere: Ar
  substrate temperature: 200° C.
  deposition thickness: 400 Å (400 Å/2000 Å=20% total thickness)
Second deposition step
  atmosphere: Ar+$O_2$
  substrate temperature: 200° C.
  deposition thickness: 1600 Å (1600 Å/2000 Å=80% total thickness)
  annealing conditions: $5 \times 10^{-6}$ Torr, 600° C. for 1 hour FIG. 5a and FIGS. 5b to 5c are transmission electron microscopic photographs showing platinum films formed, respectively, by a prior art method and the method of Example No. 2. In particular, the photographs show whether a $TiO_2$ layer is formed between the TiN layer and the platinum film or not. From the photograph of FIG. 5a, it can be seen that an insulation layer of $TiO_2$ is formed between the TiN layer and the platinum film. In contrast, as can be seen from FIG. 5b, the platinum film according to the present invention is formed directly on the top surface of the TiN layer without any oxidized insulation layer, and the platinum film has dense granular structure (FIG. 5c). The other platinum films obtained from the above examples other than Example No. 2 have shown the same results as for Example No. 2, although the photographs thereof are not presented in the drawings.

Figure 6A:
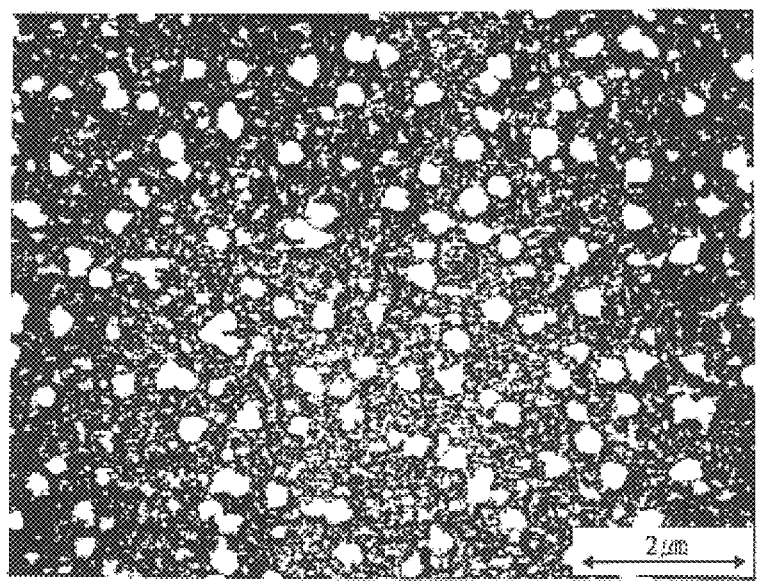
FIGS. 6a and 6b are a planar surface view and a cross-sectional view, respectively, of the microstructure of a platinum film formed on Ti/SiO$_2$/Si by the prior art method.
Figure 6B:
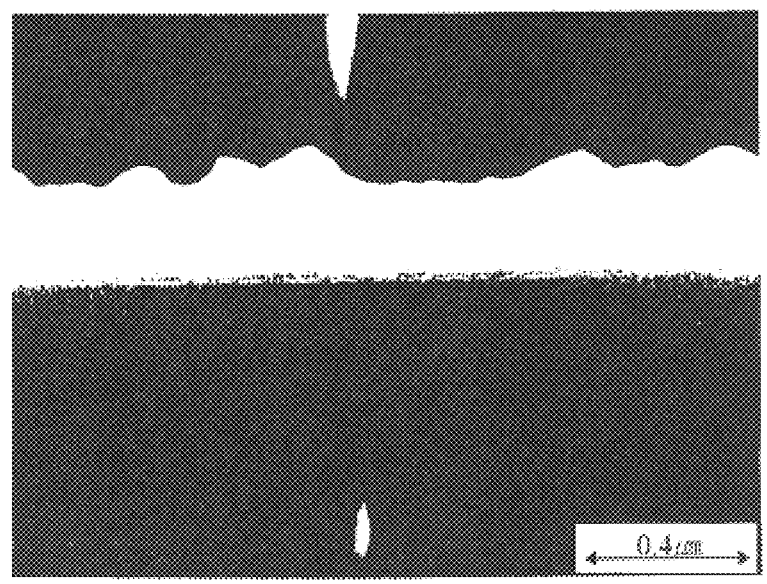

FIGS. 6a and 6b are scanning electron microscope micrographs of a planar view and a cross-sectional view, respectively, of a commercially available platinum film deposited on a $Ti/SiO_2/Si$ substrate by sputtering and then annealed at 600° C. for 1 hour in air. It can be observed that many white spots with diameters of about 0.3 μm are well dispersed over the micrograph in FIG. 6a, and there are some protrusions on the film surface in the cross-sectional view of FIG. 6b, which is more highly magnified than FIG. 6a. These spots or protrusions are generally referred to as hillocks. It is known that hillocks are formed to release compressive stress in metallic films when metallic films are heated. It has been reported that these hillocks can result in short circuits between top and bottom electrode through oxide thin films in electronic devices and the diameter of the hillocks are in the range from 0.1 μm to 0.4 μm.

Figure 7A:
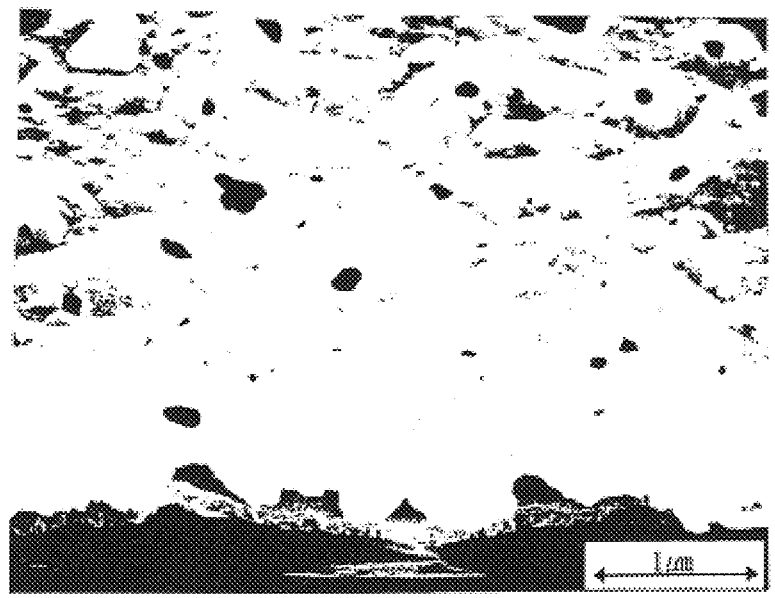
FIGS. 7a and 7b are a planar surface view and a cross-sectional view, respectively, of the microstructure of a platinum film formed on TiN/polysilicon/Si by a prior art method.
Figure 7B:
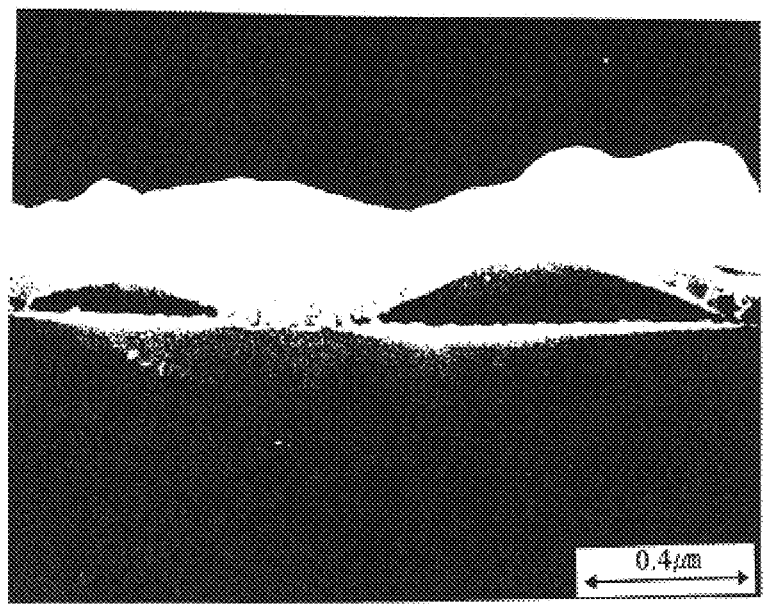

FIGS. 7a and 7b show scanning electron microscope micrographs of a planar view and a cross-sectional view, respectively, of a platinum film formed by a prior art method. The platinum film was deposited on a TiN/polysilicon/Si substrate by sputtering and then annealed at 600° C. for 1 hour in $N_2/O_2$. In FIG. 7a, many hemispherical protrusions can be observed, and dark spots with irregular shape and size ranged between 0.1 μm and 0.4 μm can also be seen. These dark spots are pinholes formed due to tensile stress. In the cross-sectional view of FIG. 7b, it can be seen that the hemispheres consist of two layers of Pt and TiN films, and the stacks of films are de-laminated from the substrate. This reveals the occurrence of the phenomenon known as buckling. It has been reported that the buckling results from nitrogen gas generated during oxidation of the underlying TiN film. As discussed earlier, when an oxide film is deposited on a Pt/TiN substrate under an oxidizing atmosphere, oxygen diffuses to the TiN layer through the Pt layer and oxidizes the TiN layer. The buckling can also result in some serious problems, such as short circuits and surface roughening of the platinum film.

Figure 8A:
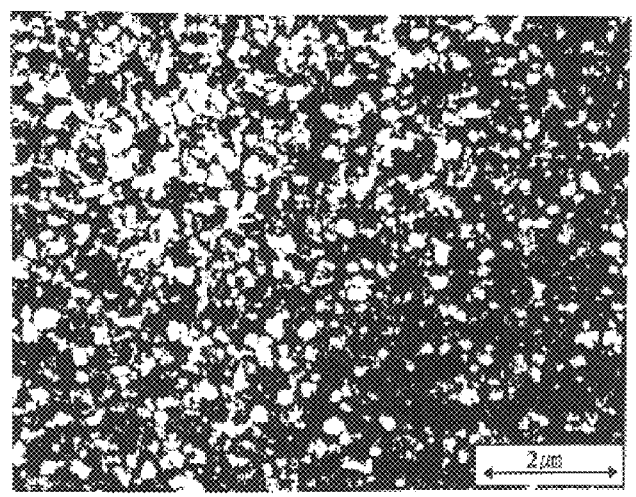
FIGS. 8a to 8b and FIG. 8c are planar surface views and a cross-sectional view, respectively, of the microstructure of a platinum film formed on TiN/polysilicon/Si in accordance with a specific embodiment of the present invention.
Figure 8B:
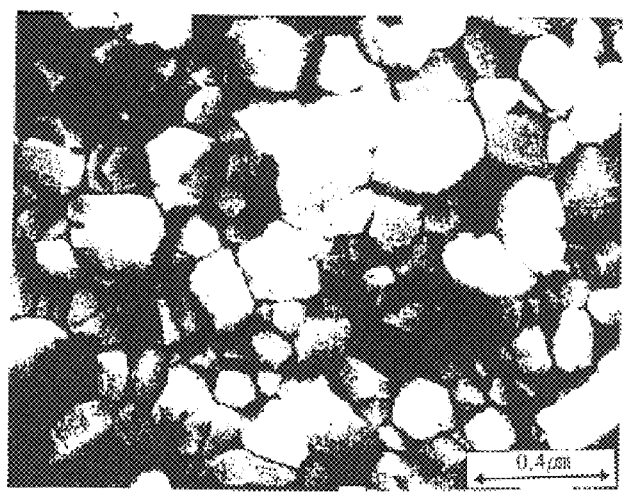
Figure 8C:
Figure 8C:
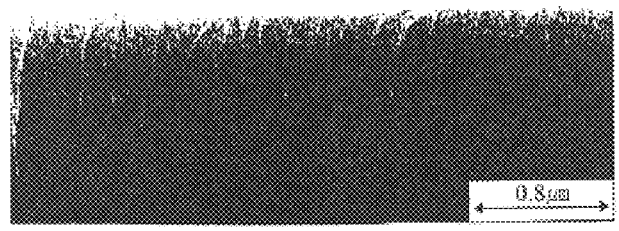
Figure 9A:
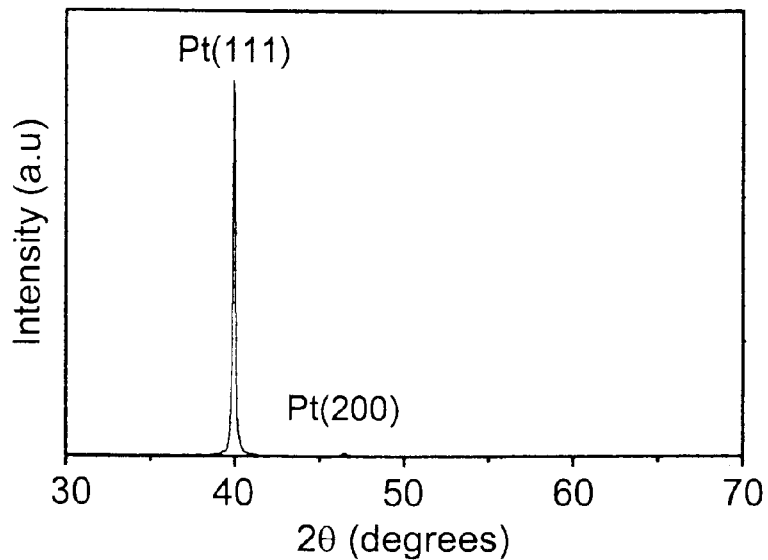
FIGS. 9a to 9d are graphs illustrating X-ray diffraction (XRD) patterns of platinum films deposited in accordance with Example Nos. 1 to 4 in accordance with specific embodiments of the present invention.
Figure 9B:
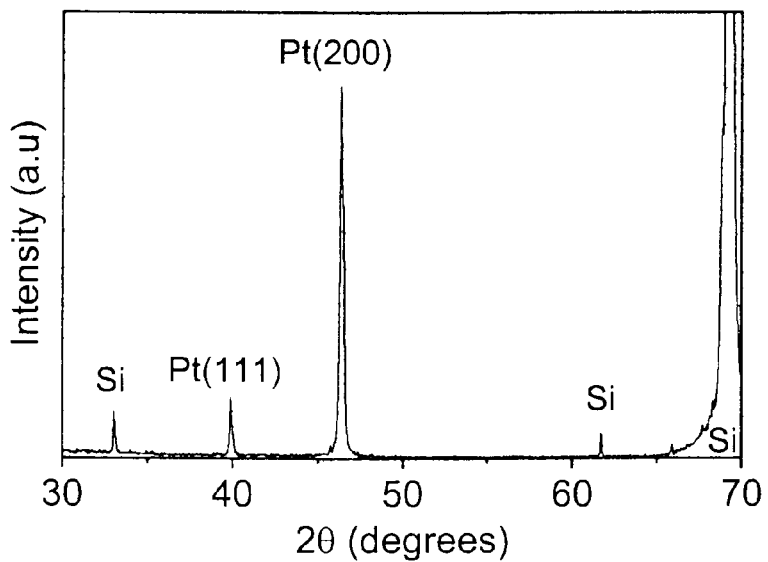
Figure 9C:
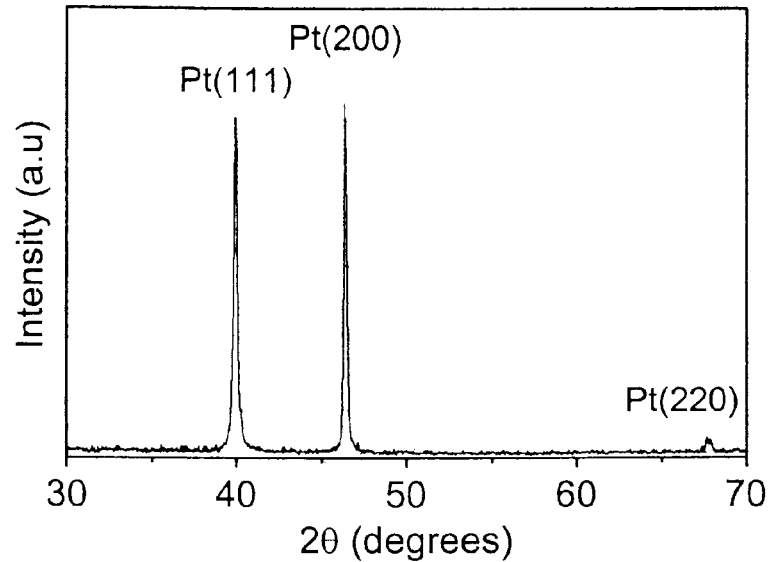
Figure 9D:
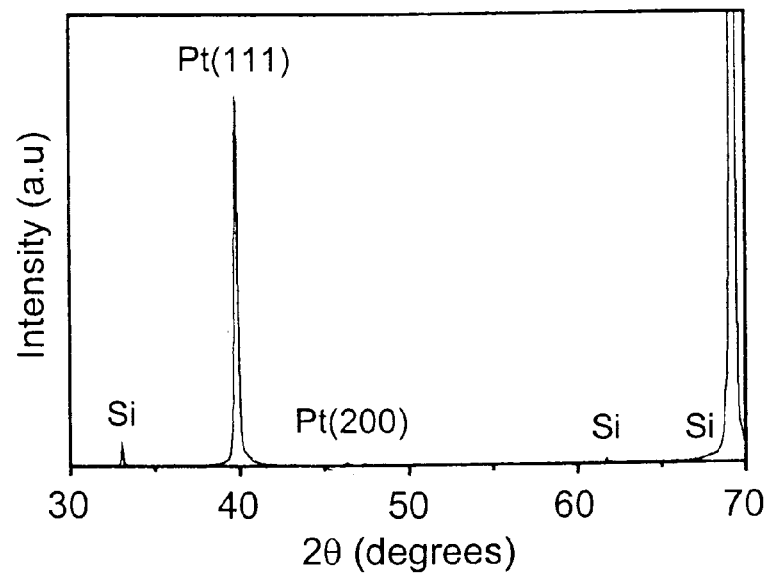

FIGS. 8a to 8b and FIG. 8c show scanning electron microscope micrographs of planar views and a cross-sectional view, respectively, of a platinum film obtained from the above Example No. 2. The platinum film was deposited on a TiN/polysilicon/Si substrate by sputtering and then annealed at 650° C. for 30 min. in air. After annealing, the platinum film was heat treated again at 650° C. for 30 min. in air. In FIG. 8a, it can be observed that the Pt film consists of relatively large grains, and there are no pinholes and no protrusions, such as hillocks or buckling. In FIG. 8b which has a higher magnification than FIG. 8a, Pt grains with angular shape are seen and no pinholes can be seen. In the cross-sectional view of FIG. 8c, it can be seen that the surface of the Pt film is smooth and clean, and there are no protrusions like as hillocks or bucklings in the film. From these observations, it can be concluded that the platinum film in accordance with the present invention is dense and has no defects, such as pores, hillocks, and bucklings. The films obtained from the other examples have shown the same results in this regard, though the other micrographs are not shown to avoid redundancy.

FIGS. 9a to 9d are graphs illustrating XRD patterns of platinum films obtained from Example Nos. 1 to 4, which show that those films have (111), (200), mixed (111) and (200), (111), and (111) preferred orientation, respectively. Although the XRD pattern of the Example No. 5 is not shown, the platinum film obtained therefrom also had (111)

preferred orientation. Showing the XRD intensity in arbitrary units (a.u.) in relation to 2θ (degrees), FIGS. 9a to 9d are the typical θ–2θ scans of the platinum films using Cu $K_\alpha$ radiation in the X-ray diffractometer performed in order to find the grains of the platinum films oriented with specific planes. From the experiments, it is concluded that the preferred orientation of platinum film can be controlled by changing at least one of the following parameters: the partial pressure ratios of oxygen, nitrogen and/or mixture thereof; temperature of substrate; post-processing (annealing) conditions: and the ratio of the thickness of the firstly deposited platinum part to the total thickness of the platinum film.

If the platinum film of the present invention is applied as a bottom electrode for a capacitor on a functional intermediate film, such as a polysilicon plug layer and an adhesion layer, of which the former may be employed in DRAM cells and the latter may be employed non-volatile memory cells, oxidation of the functional intermediate film can be prevented. Notably, even if TiN is used for a diffusion barrier layer or an adhesion layer, the buckling phenomenon is not produced at all with the present invention, since the TiN diffusion barrier layer is not oxidized during the post-processing including the deposition of a ferroelectric oxide film on the bottom electrode of platinum film and thus no $N_2$ gas is generated during the post-processing.

Further, there are no pores or hillocks in the platinum film obtained in accordance with the present invention and no buckling is generated in the film. In addition to the above, since preferred orientation of the platinum film can be controlled, the characteristics of platinum films can be adapted to electronic devices in which the anti-oxidation platinum film will be employed as a bottom electrode.

It should be understood that the above description is intended to be illustrative and not restrictive. Many embodiments will be apparent to those of skill in the art upon reviewing the above description. By way of example, the inventions herein have been illustrated primarily with regard to specific experiments on examples of platinum films formed in two steps, but it shall be understood that those films can be formed in more than two steps. For example, the second thickness platinum parts thereof can be formed in two or more separate steps. Furthermore, the invention shall not be limited by the types of functional intermediate films but shall be interpreted to include all of the modifications if the platinum film is deposited in two or more steps and the first thickness part thereof is deposited under an inert gas atmosphere and then deposition of the second thickness part followed by annealing process is performed under an atmosphere containing oxygen and/or nitrogen. Also, the annealing process performed after the platinum deposition may be performed in-situ, or in a different chamber from the deposition chamber. Those skilled in the art will recognize other equivalent or alternative methods of depositing the orientation-controlled platinum layer while remaining within the scope of the claims of the present invention. The scope of the invention should, therefore, be determined not with reference to the above description, but should instead be determined with reference to the appended claims, along with the fill scope of equivalents to which such claims are entitled.

What is claimed is:

1. A method for forming a platinum film on silicon wafer comprising:
    providing a substrate;
    forming a functional intermediate film on the substrate;
    depositing a first thickness platinum layer on the functional intermediate film under an inert gas atmosphere;
    depositing a second thickness platinum layer on top of the first thickness platinum layer under an atmosphere containing oxygen or nitrogen, or a combination thereof, wherein the first and second platinum layers comprise a platinum film;
    annealing the platinum film under a vacuum atmosphere to remove the oxygen and/or nitrogen introduced during deposition of the second thickness platinum part; and
    controlling orientation of the platinum film to a preferred orientation.

2. The method of claim 1, wherein the functional intermediate film is a diffusion barrier layer, a conductive plug, an adhesion layer, or an insulation layer.

3. The method of claim 2, wherein the functional intermediate film is a conductive plug and is formed from a material selected from the group consisting of TiN, zirconium nitride, titanium silicide, tantalum silicide, tungsten silicide, molybdenum silicide, nickel silicide, cobalt silicide, tantalum carbide, tantalum boride, polysilicon, germanium, W, Ta, Ti, Mo, TiW, boron carbide, and Cu.

4. The method of claim 2, wherein the functional intermediate film is a diffusion barrier layer and is formed from a material selected from the group consisting of ternary component amorphous materials (Ti—Si—N, Ta—B—N, Ti—B—N), conductive nitride, titanium aluminum nitride, Zr nitride, Hf nitride, Y nitride, Se nitride, La nitride, rare earth nitride, N deficient Al nitride, doped Al nitride, Mg nitride, Ca nitride, Sr nitride, Ba nitride, TiN, GaN, Ni nitride, Ta nitride, Co nitride, and W nitride.

5. The method of claim 2, wherein the functional intermediate film is an adhesion layer and is formed from a material selected from the group consisting of TiN, W, Ta, Ti, Sn, Ru, In, Ir, Os, Rh, and a silicide compound (Ni silicide, Co silicide, W silicide).

6. The method of claim 1, wherein the first thickness platinum part is formed to an extent that it can prevent the diffusion of the oxygen which can be introduced into the platinum film during the second thickness platinum part depositing step.

7. The method of claim 6, wherein the thickness of the first thickness platinum part is 5 to 50% of the total thickness of the platinum film to be deposited.

8. The method of claim 1, wherein the preferred orientation of the platinum film is controlled by changing at least one of: partial pressure ratios of oxygen, nitrogen and the mixture thereof to the entire gas in the atmosphere employed in depositing the second thickness platinum part of the platinum film; the temperature of the substrate during the deposition step; annealing temperature; and the ratio of the thickness of the first thickness platinum part to the total thickness of the platinum film.

9. The method of claim 1, wherein the inert gas is selected from the group consisting of Ar, Ne, Kr, and Xe.

10. The method of claim 1, wherein the temperature of the substrate during the deposition step does not exceed 500° C.

11. The method of claim 1, wherein the annealing temperature does not exceed 700° C.

12. The method of claim 1, wherein the depositing is performed using DC/RF sputtering, DC/RF magnetron sputtering, metal organic chemical vapor deposition, vacuum evaporation deposition, laser ablation deposition, partially ionized beam deposition, or electroplating.

13. The method of claim 1, wherein the substrate is formed from a material selected from the group consisting of silicon (Si), germanium (Ge) and diamond (C); compound materials selected from the group consisting of GaAs, InP, SiGe and SiC; ceramic single crystal (SrTiO$_3$, LaAlO$_3$, sapphire, KBr, NaCl, ZrO$_2$, Si$_3$N$_4$, TiO$_2$, Ta$_2$O$_5$, AlN) or poly-crystals thereof; metal (Au, Ag, Al, Ir, Pt, Cu, Pd, Ru, W); and amorphous/glassy materials (BSG, PSG, BPSG, Si).

14. The method of claim 1, further comprising:
   forming a high dielectric or ferroelectric film on a top surface of the platinum film.

15. The method of claim 14, wherein the functional intermediate film is a diffusion barrier layer, a conductive plug, an adhesion layer, or an insulation layer.

16. The method of claim 15, wherein the functional intermediate film is a conductive plug and is formed from a material selected from the group consisting of TiN, zirconium nitride, titanium silicide, tantalum silicide, tungsten silicide, molybdenum silicide, nickel silicide, cobalt silicide, tantalum carbide, tantalum boride, polysilicon, germanium, W, Ta, Ti, Mo, TiW, boron carbide, and Cu.

17. The method of claim 15, wherein the functional intermediate film is a diffusion barrier layer and is formed from a material selected from the group consisting of ternary component amorphous materials (Ti—Si—N, Ta—B—N, Ti—B—N), conductive nitride, titanium aluminum nitride, Zr nitride, Hf nitride, Y nitride, Se nitride, La nitride, rare earth nitride, N deficient Al nitride, doped Al nitride, Mg nitride, Ca nitride, Sr nitride, Ba nitride, TiN, GaN, Ni nitride, Ta nitride, Co nitride, and W nitride.

18. The method of claim 15, wherein the functional intermediate film is an adhesion layer and is formed from a material selected from the group consisting of TiN, W, Ta, Ti, Sn, Ru, In, Ir, Os, Rh, and a silicide compound (Ni silicide, Co silicide, W silicide).

19. The method of claim 14, wherein the first thickness part is formed to an extent that it can prevent the diffusion of the oxygen which can be introduced into the platinum film during the second thickness part depositing step.

20. The method of claim 14, wherein the thickness of the first thickness platinum part is 5 to 50% of the total thickness of the platinum film to be deposited.

21. The method of claim 20, wherein the preferred orientation of the platinum film is controlled by changing at least one of: partial pressure ratios of oxygen, nitrogen and the mixture thereof to the entire gas in the atmosphere employed in depositing the second thickness part of the platinum film; the temperature of the substrate during the deposition step; annealing temperature; and the ratio of the thickness of the first thickness platinum part to the total thickness of the platinum film.

22. The method of claim 14, wherein the inert gas is selected from the group consisting of Ar, Ne, Kr, and Xe.

23. The method of claim 14, wherein the temperature of the substrate during the deposition step does not exceed 500° C.

24. The method of claim 14, wherein the annealing temperature does not exceed 700° C.

25. The method of claim 14, wherein the depositing of platinum film is performed using DC/RF sputtering, DC/RF magnetron sputtering, metal organic chemical vapor deposition, vacuum evaporation deposition, laser ablation deposition, partially ionized beam deposition, or electroplating.

26. The method of claim 14, wherein the substrate is formed from a material selected from the group consisting of silicon (Si), germanium (Ge), and diamond (C); compound materials selected from the group consisting of GaAs, InP, SiGe, and SiC; ceramic single crystal (SrTiO$_3$, LaAlO$_3$, sapphire, KBr, NaCl, ZrO$_2$, Si$_3$N$_4$, TiO$_2$, Ta$_2$O$_5$, AlN) or poly-crystals thereof; metal (Au, Ag, Al, Ir, Pt, Cu, Pd, Ru, W); and amorphous/glassy materials (BSG, PSG, BPSG, Si).

27. The method of claim 14, wherein an insulation is formed between the substrate and the functional intermediate film, and the insulation layer is selected from the group consisting of SiO$_2$, Si$_3$N$_4$, BPSG, MgO, CaO, CaF$_2$, Al$_2$O$_3$, B$_2$O$_3$, BSG, and PSG.

28. The method of claim 14, the high-dielectric or ferroelectric material is formed from a material selected from the group consisting of perovskite structure oxides {BT (BaTiO$_3$), BST(Ba$_{1-x}$Sr$_x$TiO$_3$), ST(SrTiO$_3$), PT(PbTiO$_3$), PZT(Pb(Zr, Ti)O$_3$), PLT(Pb$_{1-x}$La$_x$TiO$_3$), PLZT(Pb$_{1-x}$La$_x$) (Zr$_y$Ti$_z$)$_{1-x/4}$O$_3$), PMN(PbMg$_{1/3}$Nb$_{2/3}$O$_3$), LiNbO$_3$, LiTaO$_3$, KNbO$_3$, K(Ta, Nb)O$_3$, CaTiO$_3$, SrSnO$_3$, NaNbO$_3$, LaAlO$_3$, YAlO$_3$, KMGF$_3$)}, bismuth-layered perovskite structure oxides {SrBi$_2$Nb$_2$O$_9$, SrBi$_2$Ti$_2$O$_9$, SrBi$_2$Ta$_2$O$_9$, SrBi$_2$(Ta$_x$Nb$_{1-x}$)$_2$O$_9$, Bi$_4$Ti$_3$O$_{12}$}, tungsten-bronze type structure oxides {Sr$_{1-x}$Ba$_x$Nb$_2$O$_6$, (Sr, Ba)$_{0.8}$R$_x$Na$_{0.4}$Nb$_2$O$_6$(R,Cr,Zn, Y), (Pb,Ba)Nb$_2$O$_6$, (K,Sr)Nb$_2$O$_6$, (Pb,K)Nb$_2$O$_6$, Pb$_2$KNb$_5$O$_{15}$, K$_3$Li$_2$Nb$_5$O$_{15}$, K, Na)$_3$Li$_2$Nb$_5$O$_{15}$, K$_2$BiNb$_5$O$_{15}$), ReMnO$_3$Re: rear-earth element), and BaMF$_4$ (M:Mn, Co, Ni, Mg, Zn)}.

* * * * *